United States Patent
Lin

(10) Patent No.: US 9,210,821 B2
(45) Date of Patent: Dec. 8, 2015

(54) LOCKING ASSEMBLY AND COMMUNICATION APPARATUS USING SAME

(71) Applicant: Shih-Wei Lin, New Taipei (TW)

(72) Inventor: Shih-Wei Lin, New Taipei (TW)

(73) Assignee: HON HAI PRECISION INDUSTRY CO., LTD., New Taipei (TW)

(*) Notice: Subject to any disclaimer, the term of this patent is extended or adjusted under 35 U.S.C. 154(b) by 351 days.

(21) Appl. No.: 13/648,262

(22) Filed: Oct. 9, 2012

(65) Prior Publication Data

US 2013/0108358 A1    May 2, 2013

(30) Foreign Application Priority Data

Oct. 31, 2011   (TW) .............................. 100220429 U

(51) Int. Cl.
| | |
|---|---|
| *B25G 3/18* | (2006.01) |
| *H05K 5/02* | (2006.01) |
| *H05K 7/14* | (2006.01) |

(52) U.S. Cl.
CPC ............ *H05K 5/0221* (2013.01); *H05K 7/1487* (2013.01); *Y10T 403/595* (2015.01); *Y10T 403/602* (2015.01); *Y10T 403/608* (2015.01)

(58) Field of Classification Search
CPC ............. Y10T 403/595; H05K 7/1487; H05K 5/0221; H01L 21/67373
USPC ................ 403/327, 330; 361/679.37, 679.57; 211/41.12
See application file for complete search history.

(56) References Cited

U.S. PATENT DOCUMENTS

| | | | | |
|---|---|---|---|---|
| 3,884,515 | A * | 5/1975 | Ashkenazi | 292/34 |
| 4,474,492 | A * | 10/1984 | Fleitas | 403/322.4 |
| 4,930,932 | A * | 6/1990 | LeVahn | 403/325 |
| 4,993,731 | A * | 2/1991 | Fuller | 280/202 |
| 4,995,430 | A * | 2/1991 | Bonora et al. | 141/98 |
| 5,586,795 | A * | 12/1996 | Sasaki | 292/336.3 |
| 5,818,689 | A * | 10/1998 | Johns et al. | 361/679.57 |
| 6,000,732 | A * | 12/1999 | Scheler et al. | 292/68 |
| 6,577,501 | B2 * | 6/2003 | Lin | 361/679.57 |
| 6,622,883 | B1 * | 9/2003 | Wu et al. | 220/323 |
| 6,783,162 | B1 * | 8/2004 | Harper | 292/40 |
| 6,880,718 | B2 * | 4/2005 | Eggum | 220/323 |
| 7,237,812 | B2 * | 7/2007 | Tweedy | 292/40 |
| 7,256,989 | B2 * | 8/2007 | Liu et al. | 361/679.33 |
| 7,518,857 | B2 * | 4/2009 | Chen et al. | 361/679.33 |
| 7,523,529 | B2 * | 4/2009 | Yang et al. | 24/611 |
| 7,549,552 | B2 * | 6/2009 | Hasegawa et al. | 220/323 |
| 7,623,345 | B2 * | 11/2009 | Shih | 361/679.58 |
| 7,681,752 | B2 * | 3/2010 | Moore | 220/326 |
| 7,755,886 | B2 * | 7/2010 | Peng et al. | 361/679.33 |
| 7,775,564 | B2 * | 8/2010 | Moore | 292/37 |

(Continued)

*Primary Examiner* — Michael P Ferguson
*Assistant Examiner* — Matthew R McMahon
(74) *Attorney, Agent, or Firm* — Novak Druce Connolly Bove + Quigg LLP

(57) ABSTRACT

A locking assembly used to lock at least one electronic device in a communication apparatus includes a housing, a latching member, a spring member and a key member. The latching member is pivotably connected to the housing by a pivoting member, and includes a pair of latching portions used to pass through the housing to be locked in the communication apparatus. The spring member is elastically connected between the housing and the latching member. The key member includes a pair of coupling portions used to be inserted into the housing and engage with the pair of receiving portions to make the latching member rotate relative to the housing about the pivoting member, so as to make the pair of latching portions to be released from the corresponding latching holes.

18 Claims, 10 Drawing Sheets

(56) References Cited

U.S. PATENT DOCUMENTS

| | | | |
|---|---|---|---|
| 8,083,272 B1 * | 12/2011 | Wu et al. | 292/156 |
| 8,091,710 B2 * | 1/2012 | Hasegawa et al. | 206/711 |
| 8,240,627 B2 * | 8/2012 | Chen et al. | 248/309.1 |
| 8,336,838 B2 * | 12/2012 | Tsai | 248/222.51 |
| 8,391,003 B2 * | 3/2013 | Kuan | 361/679.57 |
| 8,540,289 B2 * | 9/2013 | Nakatogawa et al. | 292/37 |

\* cited by examiner

LOCKING ASSEMBLY AND COMMUNICATION APPARATUS USING SAME

BACKGROUND

1. Technical Field

The present disclosure relates to communication apparatuses, and more particularly to a locking assembly to lock an electronic device in a communication apparatus.

2. Description of Related Art

Generally, many electronic devices incorporate modular components such as removable power supplies, removable hard disks, and removable fans. Such components have been widely used in computers, servers, redundant arrays of independent disks (RAIDs), and other communication apparatuses. These electronic devices can, for example, supply continuous electric power or data storage space. In addition, these electronic devices provide users the convenience of easily taking out or exchanging a power supply, a hard disk or a fan, for example.

A common kind of electronic device, such as a removable hard disk, is mounted in a housing structure by bolts or screws. When the electronic device needs to be taken out from the housing structure, the bolts or screws must firstly be removed. Therefore, it is inconvenient to install or remove the electronic device into or from the housing structure.

Therefore, a need exists in the industry to overcome the described limitations.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, all the views are schematic, and like reference numerals designate corresponding parts throughout the several views.

DETAILED DESCRIPTION

The disclosure is illustrated by way of example and not by way of limitation in the figures of the accompanying drawings. It should be noted that references to "an" or "one" embodiment in this disclosure are not necessarily to the same embodiment, and such references can mean "at least one."

Figure 1:
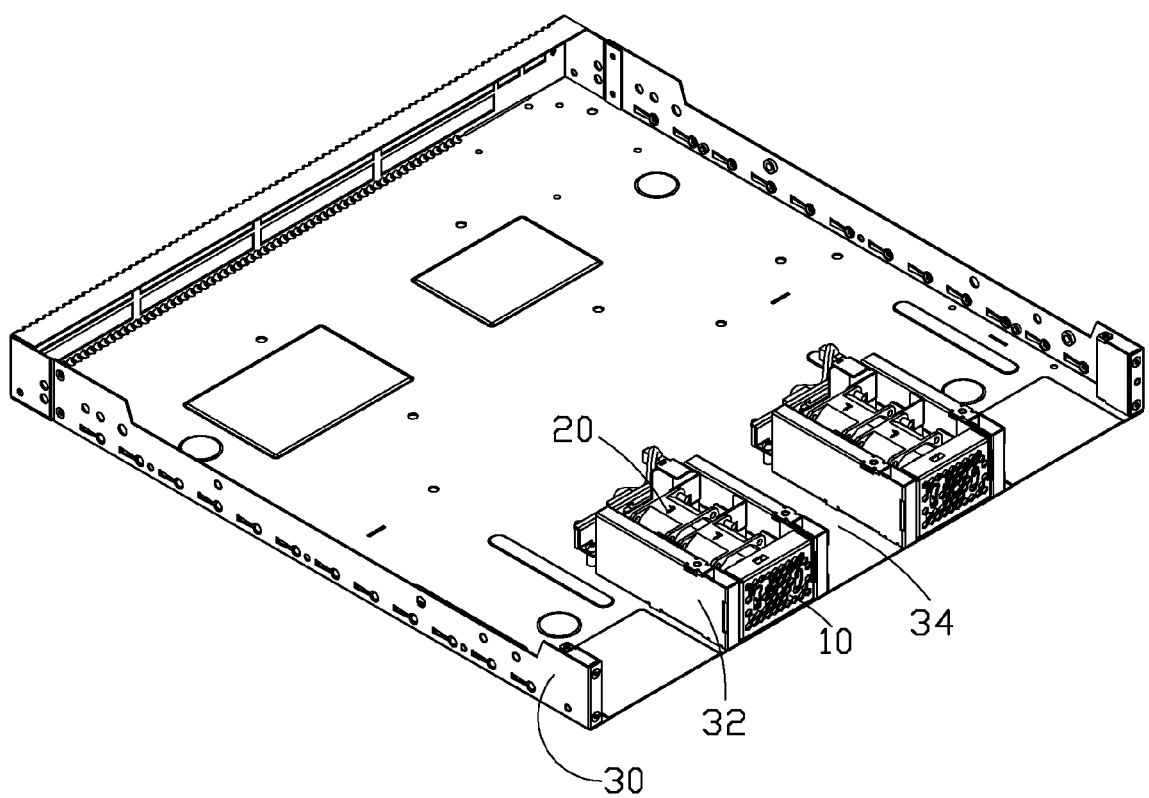
FIG. 1 is a schematic view of an exemplary embodiment of a locking assembly employed in a communication apparatus in accordance with the present disclosure, showing two locking assemblies securing a plurality of electronic devices in the communication apparatus.

Referring to FIG. 1, a locking assembly 10 is used to lock at least one electronic device 20 in a communication apparatus 30, or remove the at least one electronic device 20 from the communication apparatus 30. In the illustrated embodiment, the at least one electronic device 20 may be a removable power supply, a removable hard disk or a removable fan, and accordingly the communication apparatus 30 may be a computer, a server, a redundant array of an independent disks (RAID), for example. The communication apparatus 30 comprises a pair of securing brackets 32 parallel with each other to collectively define an accommodate space 34. The locking assembly 10 is received in the accommodate space 34 and latched to the pair of securing brackets 32 to lock the electronic device 20 in the communication apparatus 30.

Figure 2:
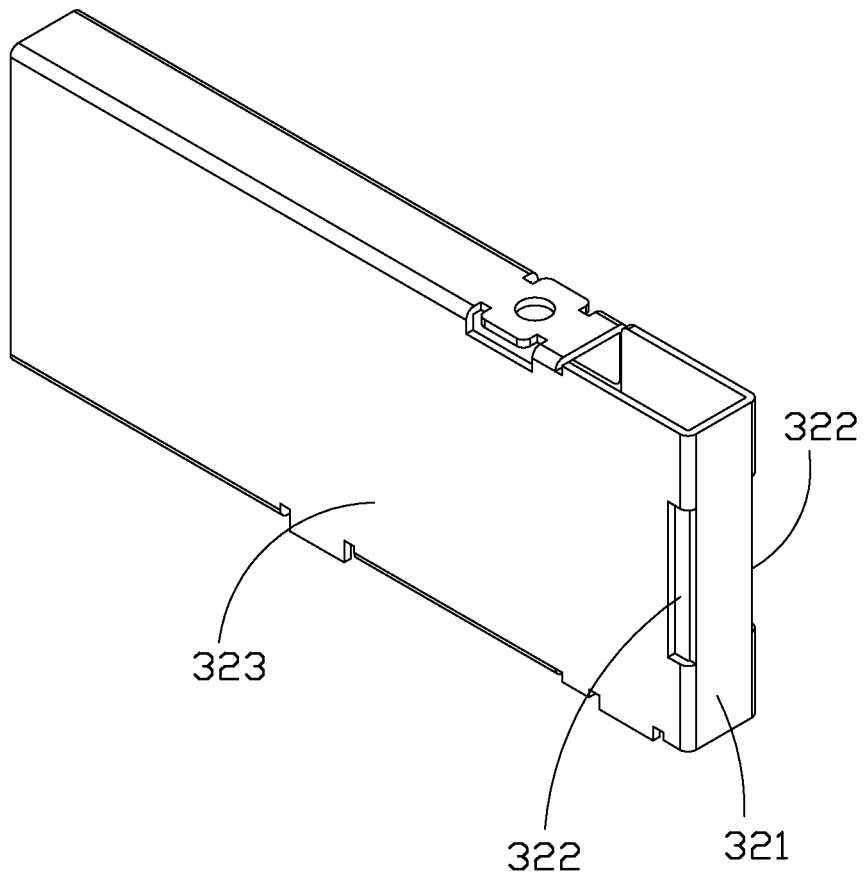
FIG. 2 is a schematic view of a securing bracket of the communication apparatus of FIG. 1.

Referring to FIG. 2, each of the pair of securing brackets 32 defines a latching hole 322. The pair of latching holes 322 of the pair of securing brackets 32 are opposite to each other and configured to cooperatively engage with the locking assembly 10 received between the pair of securing brackets 32. In this embodiment, each of the pair of securing brackets 32 comprises a front wall 321 and a pair of sidewalls 323 extending perpendicularly in a same direction from two opposite edges of the front wall 321. In assembly, the two front walls 321 of the pair of securing brackets 32 are coplanar with each other, and the two pairs of sidewalls 323 of the pair of securing brackets 32 are opposite and parallel with each other. Each of the pair of securing brackets 32 defines two latching holes 322 respectively formed at junctions between the front wall 321 and the pair of sidewalls 323.

Figure 3:
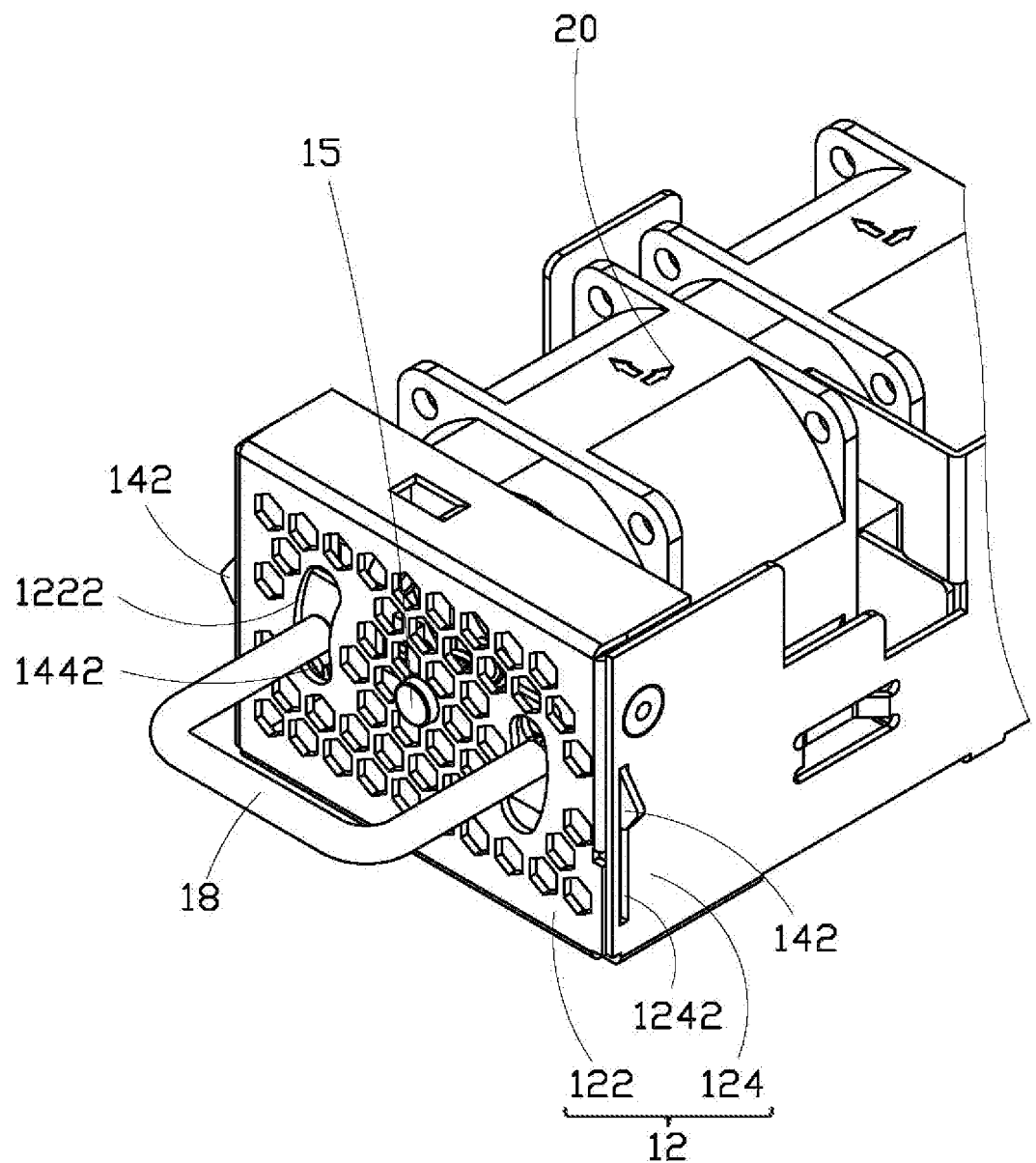
FIG. 3 is a partially enlarged schematic view of the locking assembly of FIG. 1, in which the electronic devices are received.
Figure 4:
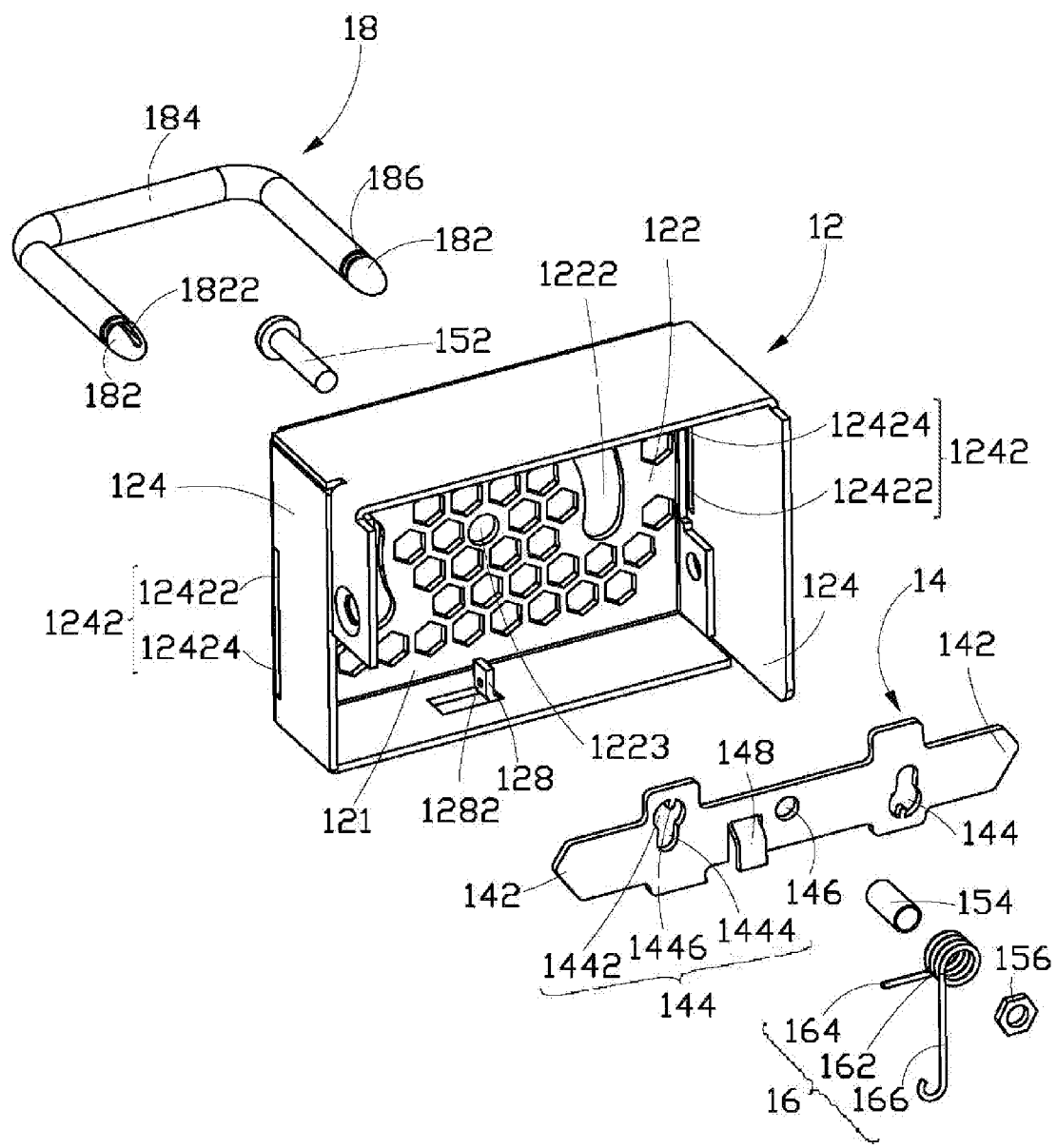
FIG. 4 is a disassembled schematic view of the locking assembly.

Referring to FIGS. 3-4, the locking assembly 10 comprises a housing 12, a latching member 14, a spring member 16 and a key member 18. The housing 12 defines a receiving room 121, in which the latching member 14, the spring member 16 and the electronic devices 20 are received. The housing 12 comprises an installing board 122 and a pair of side boards 124 cooperatively defining the receiving room 121. The installing board 122 perpendicularly connects between the pair of side boards 124. The installing board 122 defines a central hole 1223 and a pair of openings 1222 symmetrically located on two opposite sides of the central hole 1223. In this embodiment, the pair of openings 1222 are configured as a pair of concentric arcuate-shaped openings, and the central hole 1223 is located at the central of the pair of concentric arcuate shaped openings 1222. Each of the pair of side boards 124 defines a through hole 1242. In assembly, the pair of through holes 1242 respectively face the corresponding latching holes 322 of the securing brackets 32. Each of the through holes 1242 is close to the installing board 122 and defines a first portion 12422 and a second portion 12424 communicating with each other. The two first portions 12422 are opposite with each other. The two second portions 12424 are located on alternating sides of the two first portions 12422. That is, as shown in FIG. 4, one of the second portions 12424 is close to a bottom portion of the installing board 122, and the other one of the second portions 12424 is close to a top portion of the installing board 122.

The latching member 14 is pivotably connected to the installing board 122 by engagement between a pivoting member 15 and the central hole 1223. The latching member 14 comprises a pair of latching portions 142 respectively located at two opposite edges of the latching member 14 and used to pass through the corresponding through holes 1242 and engage with the corresponding latching holes 322 to be latched in the communication apparatus 30. The latching member 14 defines a positioning hole 146 located at a center of the latching member 14 and a pair of receiving portions 144 arranged symmetrically around the positioning hole 146. In assembly, the pivoting member 15 engages with the central hole 1223 and the positioning hole 146 to pivotably connect the latching member 14 to the installing board 122, with the pair of latching portions 142 respectively passing through the through holes 1242 and the pair of receiving portions 144 respectively overlapping on the pair of openings 1222. The latching member 14 further comprises a securing hook 148 located between the positioning hole 146 and one of the pair of receiving portions 144.

Figure 8:
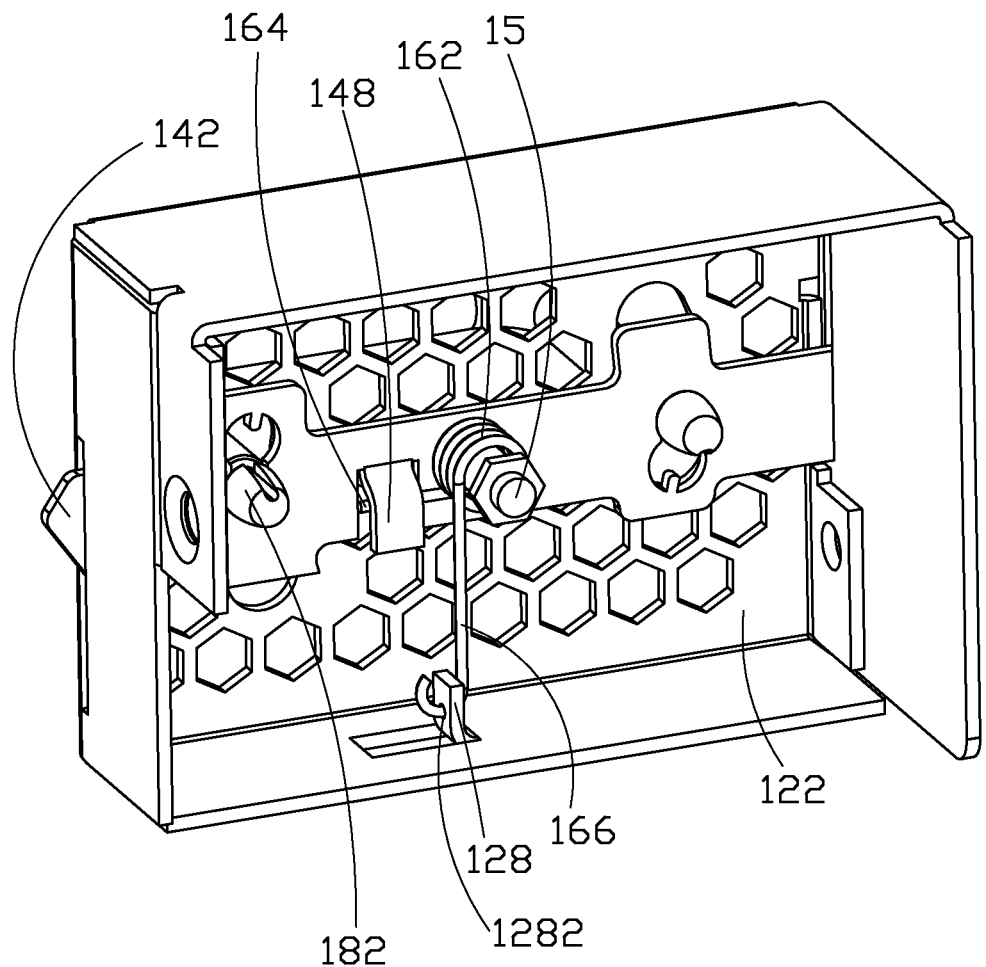
FIG. 8 is similar to FIG. 7, but showing from another aspect.
Figure 10:
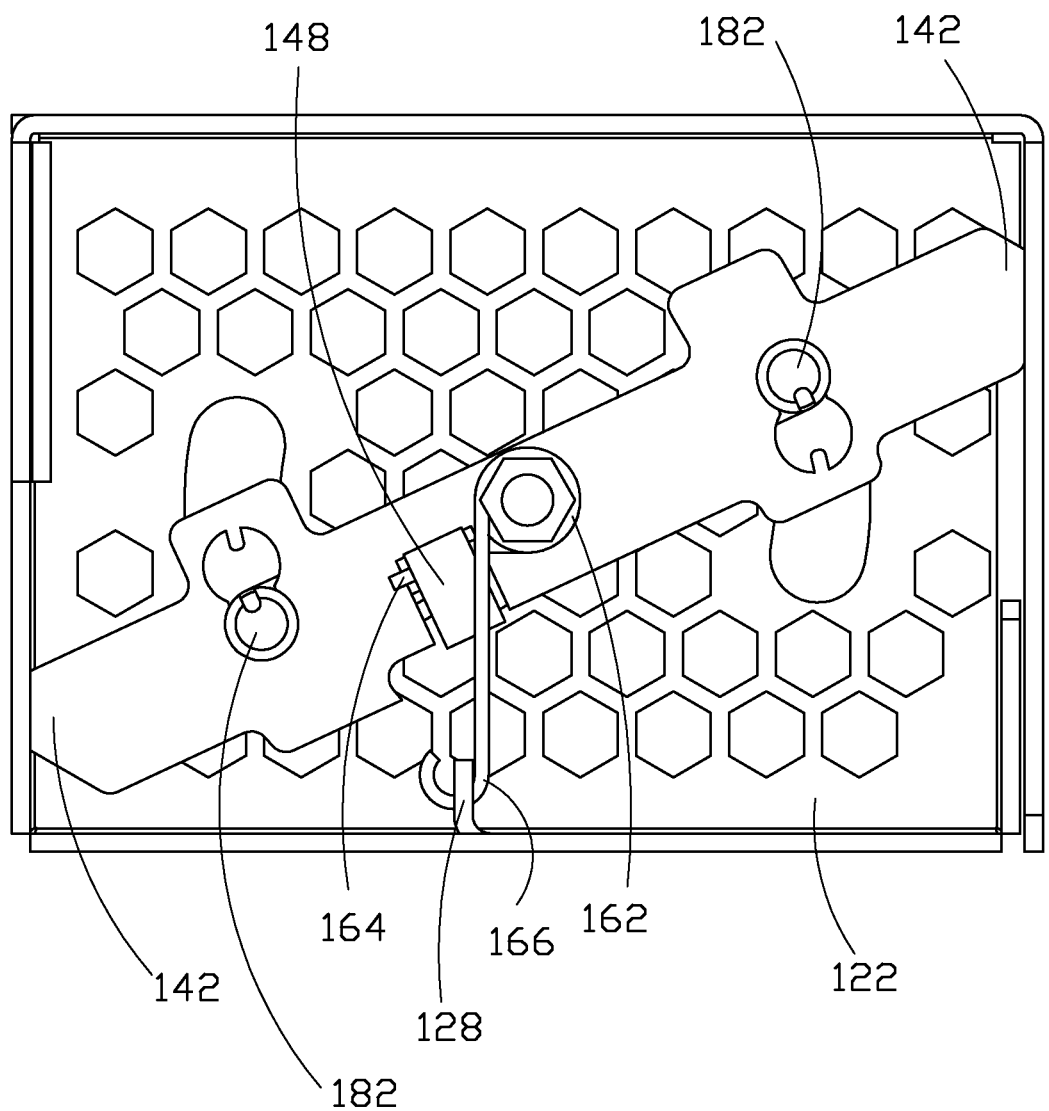
FIG. 10 is similar to FIG. 9, but showing from another aspect.

The pivoting member 15 comprises a screw 152, a sleeve 154 and a nut 156. The screw 152 passes through the central hole 1223, the positioning hole 146 and the sleeve 154. The nut 156 engages with the screw 152 to install the latching member 14 on the installing board 122. The spring member 16 is elastically connected between the housing 12 and the latching member 14. The spring member 16 is configured in a natural state (not stretched nor compressed) when the locking assembly 10 is configured in a latching state, as shown in FIG. 8. The spring member 16 is configured in an elastically deformed state, when the locking assembly 10 is configured in an unlatched state, as shown in FIG. 10. In this embodiment, the spring member 16 is a torsion spring. The spring member 16 comprises a bending portion 162, a first fixing end 164 and a second fixing end 166. In assembly, the bending portion 162 is placed around the sleeve 154 of the pivoting member 15, the first fixing end 164 is fixed to the securing hook 148 of the latching member 14, and the second fixing end 166 is fixed to a fixing tab 128 of the housing 12. Referring to FIG. 8, the second fixing end 166 passes through a fixing hole 1282 of the fixing tab 128 to be fixed to the housing 12, and the first fixing end 164 resists to the securing hook 148 due to elastic potential energy of the spring member 16.

Figure 5:
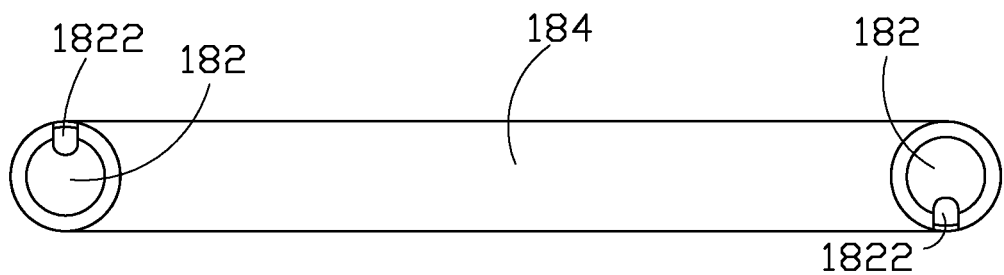
FIG. 5 is a schematic view a key member of the locking assembly.
Figure 6:
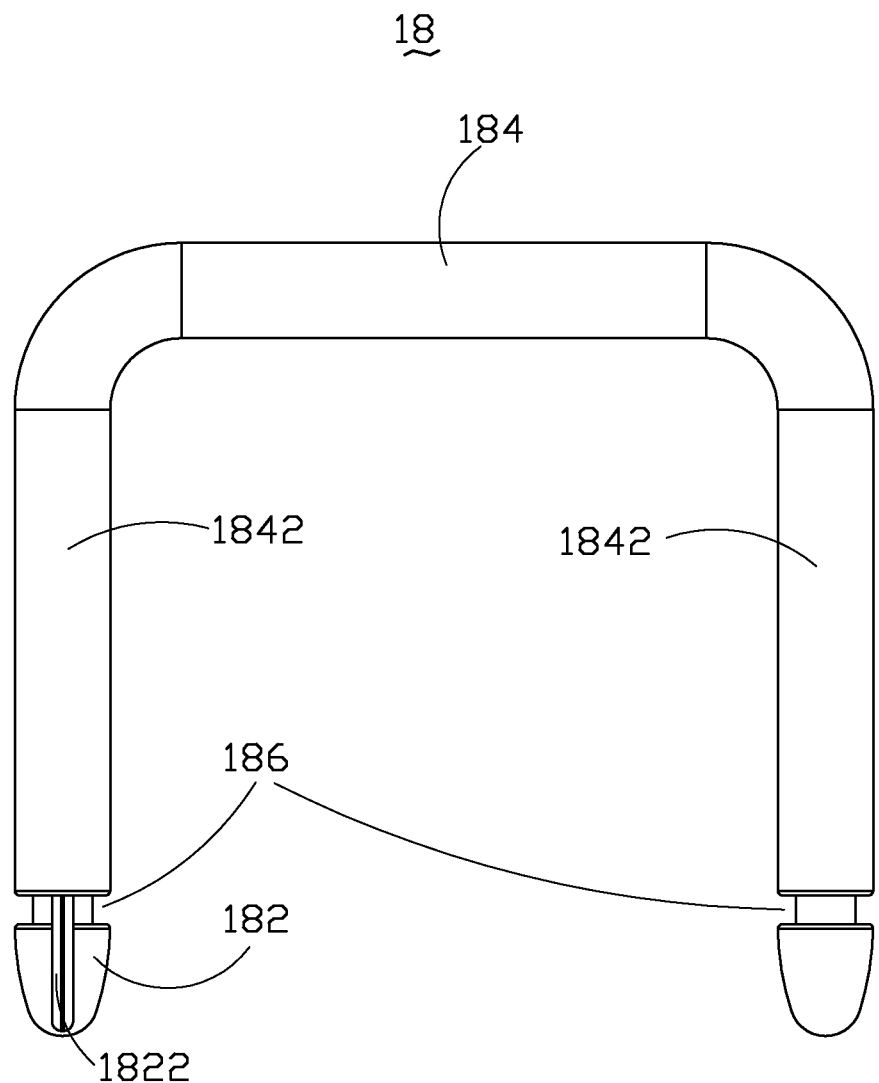
FIG. 6 is a schematic view the key member of FIG. 5, but showing from another aspect.
Figure 7:
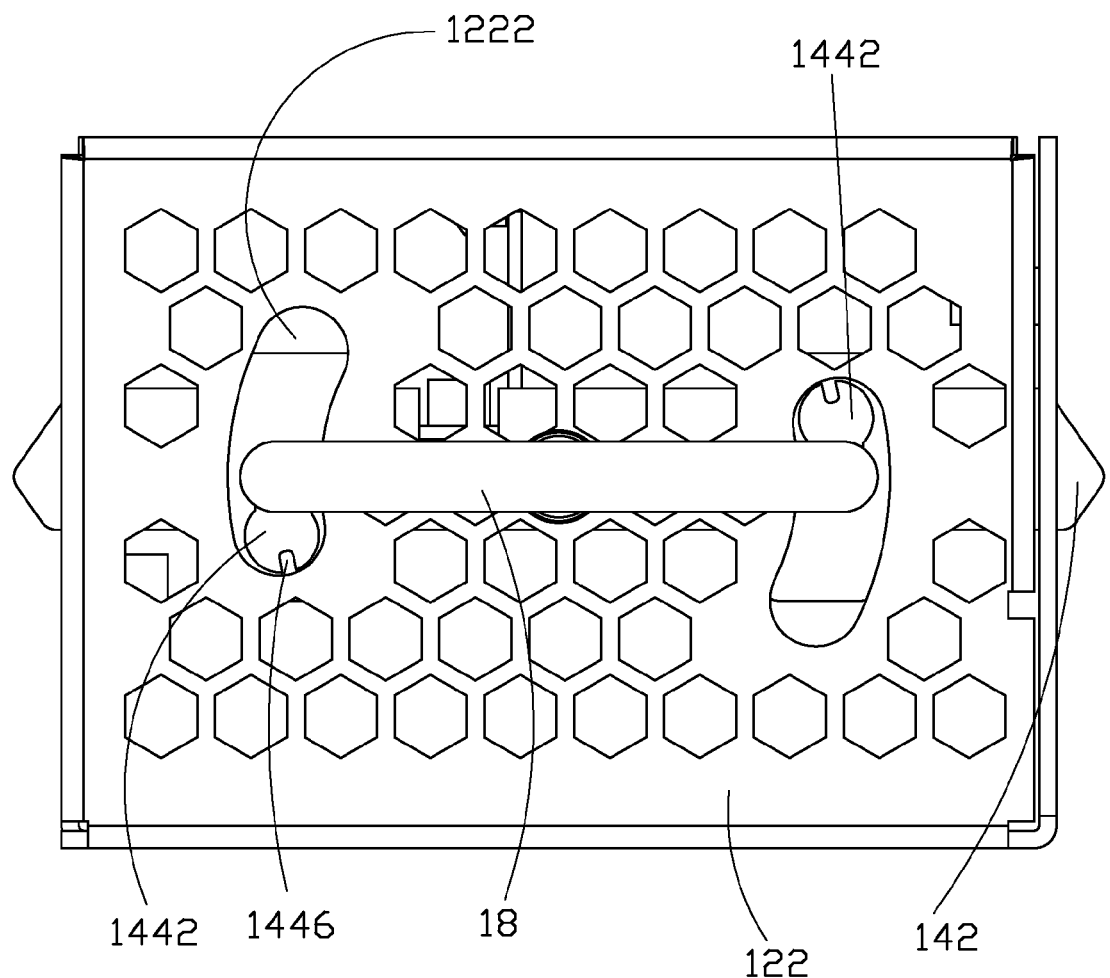
FIG. 7 is a schematic view of the locking assembly configured in a latching state.

Referring to FIGS. 5-6, the key member 18 comprises a pair of coupling portions 182 and a handle 184 connected between the pair of coupling portions 182. In this embodiment, the handle 184 comprises two connecting poles 1842 parallel with each other. The pair of coupling portions 182 are respectively formed on a free end of the connecting poles 1842. The pair of coupling portions 182 are used to respectively pass through the pair of openings 1222 of the housing 12 to be inserted into the receiving room 121 and respectively engage with the receiving portions 144 of the latching member 14. The handle 184 is used to be operated to drive the pair of coupling portions 182 to engage with the receiving portions 144 and make the latching member 14 rotate relative to the housing 12 about the pivoting member 15. Finally, the pair of latching portions 142 of the latching member 14 is released from the corresponding latching holes 322 of the securing brackets 32 by the key member 18. Simultaneously, the locking assembly 10 can be pulled out from the communication apparatus 30 by the key member 18.

In this embodiment, each of the receiving portions 144 defines an access hole 1442 and an engaging hole 1444 communicating with each other. The engaging hole 1444 has a smaller size than size of the access hole 1442. The two engaging holes 1444 of the pair of receiving portions 144 are opposite to each other and symmetrically located on two sides of the positioning hole 146 of the latching member 14. The two access holes 1442 of the pair of receiving portions 144 are respectively located on two sides of the two engaging holes 1444. Referring to FIG. 4, the access hole 1442 of the left receiving portion 144 is close to top of the latching member 14, and the access hole 1442 of the right receiving portion 144 is close to bottom of the latching member 14. Each of the receiving portions 144 comprises a projecting tab 1446 protruding from an inner wall of the corresponding access hole 1442 toward the engaging hole 1444.

The key member 18 defines a pair of latching grooves 186 respectively configured between the pair of coupling portions 182 and the connecting poles 1842 of the handle 184. Each of the pair of coupling portions 182 defines a sliding slot 1822 extending between a free end of the corresponding coupling portion 182 and the corresponding latching groove 186. The pair of sliding slots 1822 are straight-shaped. The pair of latching grooves 186 are annular-shaped. Each of the pair of coupling portions 182 has a smaller size than size of the access hole 1442, thus, the pair of coupling portions 182 can pass through the pair of access holes 1442 and be inserted into the receiving room 121 of the housing 12. Each of the pair of coupling portions 182 has a larger size than the size of engaging hole 1444.

Figure 9:
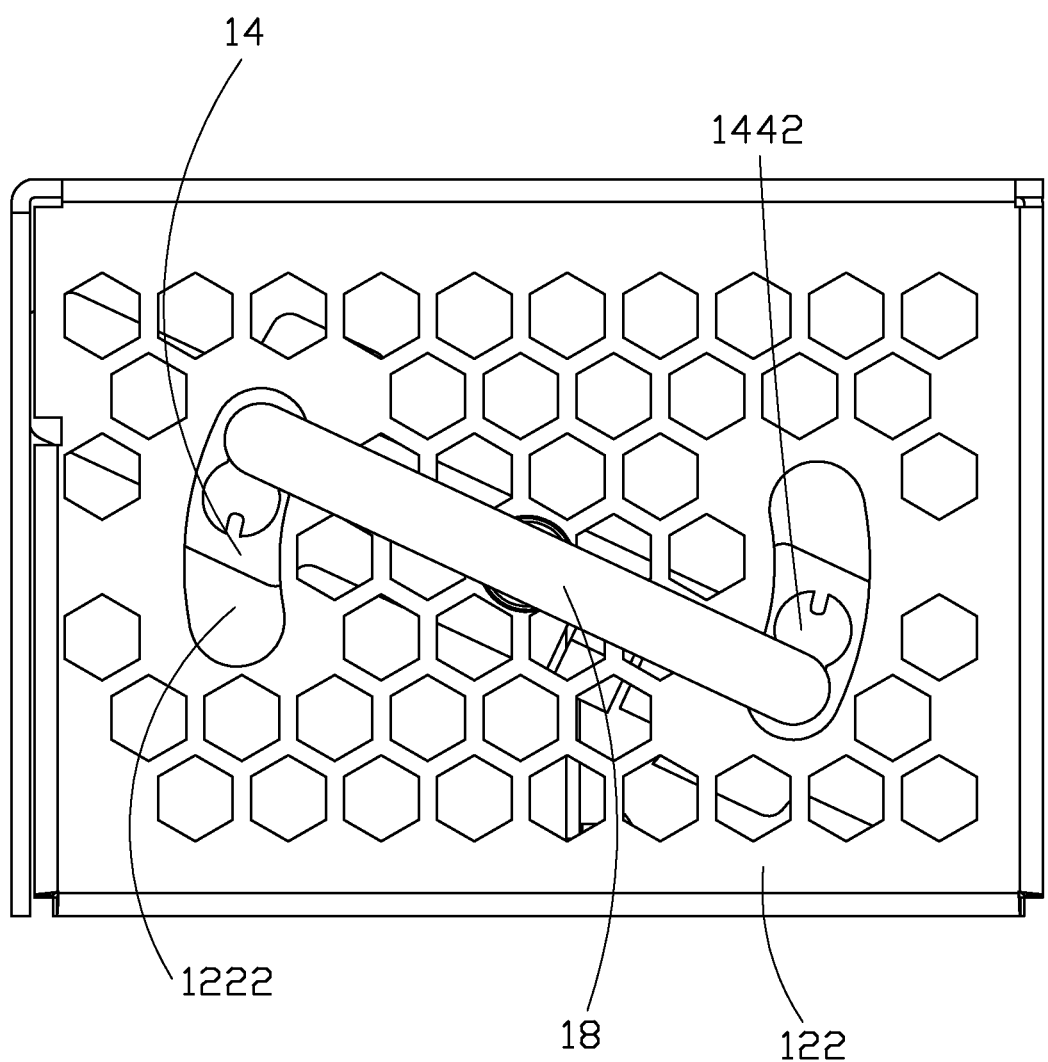
FIG. 9 is a schematic view of the locking assembly configured in an unlatched state.

The spring member 16 is configured in a natural state when the locking assembly 10 is configured in a latching state, as shown in FIG. 8. When the electronic devices 20 are required to be removed from the communication apparatus 30, the key member 18 acts as a tool for an operator to unlock the locking assembly 10. In use, the sliding slots 1822 of the pair of coupling portions 182 are aimed at the projecting tabs 1446 formed in the pair of access holes 1442, and the pair of coupling portions 182 are inserted into the receiving room 121, then the key member 18 is rotated to make the pair of coupling portions 182 move toward the pair of engaging holes 1444. Finally, the pair of latching grooves 186 engage with the latching member 14, and the handle 184 and the pair of coupling portions 182 are respectively secured on two sides of the latching member 14. The key member 18 is rotated continually to drive the latching member 14 rotate relative to the housing 12, and make the latching portions 142 of the latching member 14 to be retreated from the latching holes 322 of the securing brackets 32, shown in FIGS. 9-10. In this state, the key member 18 can be pulled to remove the locking assembly 10 from the accommodate space 34 of the communication apparatus 30.

The latching member 14 can be moved back to the latching state under the elastic potential energy of the spring member 16, when the key member 18 is removed from the latching member 14.

Although the features and elements of the present disclosure are described as embodiments in particular combinations, each feature or element can be used alone or in other various combinations within the principles of the present disclosure to the full extent indicated by the broad general meaning of the terms in which the appended claims are expressed.

What is claimed is:

1. A locking assembly, used to lock at least one electronic device in a communication apparatus, the communication apparatus comprising a pair of securing brackets, the locking assembly comprising:

a housing defining a receiving room;

a latching member received in the receiving room, and pivotably connected to the housing by a pivoting member, the latching member comprising a pair of receiving portions arranged symmetrically around the pivoting member and a pair of latching portions passing through the housing and configured for insertion into the pair of securing brackets;

a spring member elastically connected between the housing and the latching member, the spring member configured in a natural state when the pair of latching portions is latched in the communication apparatus; and a key member comprising a pair of coupling portions and a handle connected between the pair of coupling portions, wherein manipulation of the handle drives the pair of coupling portions to be inserted into the housing and engages with the pair of receiving portions to make the latching member rotate relative to the housing about the pivoting member, so as to make the pair of latching portions to be released from the securing brackets;

wherein each of the receiving portions defines an access hole and an engaging hole, which has a smaller size than the access hole, communicating with each other, the two engaging holes are opposite to each other and symmetrically located on two sides of the pivoting member, the two access holes are respectively located on two sides of the two engaging holes, the key member defines a pair of latching grooves respectively configured between the pair of coupling portions and the handle and used to engage with the engaging holes of the receiving portions.

2. The locking assembly of claim 1, wherein the housing comprises an installing board and a pair of side boards cooperatively defining the receiving room, the installing board defines a pair of concentric arcuate-shaped openings symmetrically located on two opposite sides of the pivoting member, the pair of receiving portions respectively overlap on the pair of concentric arcuate-shaped openings, the pair of coupling portions pass through the pair of concentric arcuate-shaped openings.

3. The locking assembly of claim 2, wherein each of the pair of side boards defines a through hole facing the securing brackets, used to receive a corresponding latching portion of the latching portion, and close to the installing board, each of the through holes defines a first portion and a second portion communicating with each other, the two first portions are opposite with each other, and the two second portions are located on alternating sides of the two first portions.

4. The locking assembly of claim 1, wherein each of the receiving portions comprises a projecting tab secured on an inner wall of the latching member surrounding the corresponding access hole and protruding from the inner wall, each of the pair of coupling portions defines a sliding slot extending between a free end of the corresponding coupling portion and the corresponding latching groove, the sliding slots are used to engage with the projecting tabs to make the coupling portions to be inserted into the receiving room.

5. The locking assembly of claim 4, wherein the pair of latching grooves are annular-shaped, and the pair of sliding slots are straight-shaped.

6. The locking assembly of claim 1, wherein the spring member comprises a bending portion placed around the pivoting member, a first fixing end fixed to the latching member and a second fixing end fixed to the housing.

7. The locking assembly of claim 6, wherein the latching member comprises a securing hook used to fix the first fixing end, the housing comprising a fixing tab defining a fixing hole, the second fixing end passes through the fixing hole of the fixing tab to be fixed to the housing, and the first fixing end resists to the securing hook due to elastic potential energy of the spring member.

8. The locking assembly of claim 1, wherein the pivoting member comprises a screw, a sleeve and a nut, the screw passes through the housing, the latching member and the sleeve to engage with the nut to pivotably install the latching member to the housing.

9. A communication apparatus, comprising:
a pair of securing brackets that are parallel with each other to collectively define an accommodate space; and
a locking assembly received in the accommodate space and used to lock at least one electronic device in the communication apparatus, the locking assembly comprising:
a housing defining a receiving room;
a latching member received in the receiving room, and pivotably connected to the housing by a pivoting member, the latching member comprising a pair of receiving portions arranged symmetrically around the pivoting member and a pair of latching portions used to pass through the housing and engage with the pair of securing brackets;
a spring member elastically connected between the housing and the latching member, the spring member configured in a natural state when the pair of latching portions is latched in the securing brackets, the spring member configured in an elastically deformed state when the latching member is rotated relative to the housing when the pair of latching portions are unlatched in the securing brackets to make the electronic device to be pulled out of the communication apparatus, and the latching member moved back to the latching state under the elastic potential energy of the spring member; and
a key member comprising a pair of coupling portions and a handle connected between the pair of coupling portions, wherein operation of the handle drives the pair of coupling portions to be inserted into the housing and engages with the pair of receiving portions to make the latching member rotate relative to the housing about the pivoting member, so as to make the pair of latching portions to be released from the corresponding securing brackets;

wherein each of the receiving portions defines an access hole and an engaging hole, which has a smaller size than the access hole, communicating with each other, the two engaging holes are opposite to each other and symmetrically located on two sides of the pivoting member, the two access holes are respectively located on two sides of the two engaging holes, the key member defines a pair of latching grooves respectively configured between the pair of coupling portions and the handle and used to engage with the engaging holes of the receiving portions.

10. The communication apparatus of claim 9, wherein each of the receiving portions comprises a projecting tab protruding from an inner wall of the corresponding access hole toward the engaging hole, each of the pair of coupling portions defines a sliding slot extending between a free end of the corresponding coupling portion and the corresponding latching groove, the sliding slots are used to engage with the projecting tabs to make the coupling portions to be inserted into the receiving room.

11. The communication apparatus of claim 10, wherein the pair of latching groove are annular-shaped, and the pair of sliding slots are straight-shaped.

12. The communication apparatus of claim 9, wherein the spring member comprises a bending portion placed around the pivoting member, a first fixing end fixed to the latching member and a second fixing end fixed to the housing.

13. The communication apparatus of claim 12, wherein the latching member comprises a securing hook used to fix the first fixing end, the housing comprising a fixing tab defining a fixing hole, the second fixing end passes through the fixing hole of the fixing tab to be fixed to the housing, and the first fixing end resists to the securing hook due to elastic potential energy of the spring member.

14. The communication apparatus of claim 9, wherein the pivoting member comprises a screw, a sleeve and a nut, the screw passes through the housing, the latching member and the sleeve to engage with the nut to pivotably install the latching member to the housing.

15. A locking assembly, used to lock at least one electronic device in a communication apparatus, the communication apparatus comprising a pair of securing brackets, the locking assembly comprising:
  a housing;
  a latching member received in the housing and pivoted to the housing, opposite ends of the latching member forming a pair of latching portions, the latching portions passing through the housing; and
  a spring member elastically connected between the housing and the latching member, the spring member configured in a natural state when the pair of latching portions are latched in the securing brackets, when the latching member is rotated relative to the housing by an external force, the pair of latching portions rotate along with the latching member with respect to the housing to receive into the housing and disengage from the securing brackets, the spring member changes into an elastically deformed state and generates an elastic force, and when the external force is release, the latching member moves back to latch in the securing brackets under the elastic force;
  wherein the latching member is pivoted to the housing by a pivoting member and further comprises a pair of receiving portions, each of the receiving portions defines an access hole and an engaging hole, which has a smaller size than the access hole, communicating with each other, the two engaging holes are opposite to each other and symmetrically located on two sides of the pivoting member, and the two access holes are respectively located on two sides of the two engaging holes.

16. The locking assembly of claim 15, further comprising a key member, wherein the key member comprises a pair of coupling portions and a handle connected between the pair of coupling portions, wherein manipulation of the handle drives the pair of coupling portions to be inserted into the housing and engages with the pair of receiving portions to make the latching member rotate relative to the housing about the pivoting member.

17. The locking assembly of claim 16, wherein the key member further defines a pair of latching grooves respectively configured between the pair of coupling portions and the handle and used to engage with the engaging holes of the receiving portions.

18. The locking assembly of claim 17, wherein each of the pair of coupling portions defines a sliding slot extending between a free end of the corresponding coupling portion and the corresponding latching groove, each of the receiving portions comprises a projecting tab secured on an inner wall of the latching member surrounding the corresponding access hole and protruding from the inner wall, and the sliding slots are used to engage with the projecting tabs to make the coupling portions to be inserted into the housing.

* * * * *